(12) United States Patent
Kim et al.

(10) Patent No.: US 12,176,061 B2
(45) Date of Patent: Dec. 24, 2024

(54) PROGRAMMABLE MEMORY TIMING

(71) Applicant: Micron Technology, Inc., Boise, ID (US)

(72) Inventors: Kang-Yong Kim, Boise, ID (US); Hyun Yoo Lee, Boise, ID (US); Timothy M. Hollis, Meridian, ID (US); Dong Soon Lim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/420,404

(22) Filed: Jan. 23, 2024

(65) Prior Publication Data
US 2024/0161796 A1 May 16, 2024

Related U.S. Application Data

(63) Continuation of application No. 17/562,560, filed on Dec. 27, 2021, now Pat. No. 11,894,099.
(Continued)

(51) Int. Cl.
*G11C 7/10* (2006.01)
*G06F 3/06* (2006.01)
(Continued)

(52) U.S. Cl.
CPC .......... *G11C 7/1087* (2013.01); *G06F 3/0679* (2013.01); *G06F 13/1689* (2013.01);
(Continued)

(58) Field of Classification Search
CPC ..... G11C 7/1087; G11C 7/22; G11C 11/4093; G11C 29/10; G11C 29/022; G11C 29/028; G06F 3/0679; G06F 13/1689
See application file for complete search history.

(56) References Cited

U.S. PATENT DOCUMENTS

| 6,034,878 A | 3/2000 | Osaka et al. |
| 7,587,640 B2 * | 9/2009 | Mobin ............... G06F 13/4213 714/700 |

(Continued)

FOREIGN PATENT DOCUMENTS

| KR | 20080006499 | 1/2008 |
| WO | 2009038587 | 3/2009 |

OTHER PUBLICATIONS

"International Preliminary Report on Patentability", Application No. PCT/US2021/065330, Jul. 4, 2023, 8 pages.
(Continued)

*Primary Examiner* — Son L Mai
(74) *Attorney, Agent, or Firm* — Colby Nipper PLLC

(57) ABSTRACT

Described apparatuses and methods enable communication between a host device and a memory device to establish relative delays between different data lines. If data signals propagate along a bus with the same timing, simultaneous switching output (SSO) and crosstalk can adversely impact channel timing budget parameters. An example system includes an interconnect having multiple data lines that couple the host device to the memory device. In example operations, the host device can transmit to the memory device a command indicative of a phase offset between two or more data lines of the multiple data lines. The memory device can implement the command by transmitting or receiving signals via the interconnect with different relative phase offsets between data lines. The host device (e.g., a memory controller) can determine appropriate offsets for a given apparatus. Lengths of the offsets can vary. Further, a system can activate the phase offsets based on frequency.

20 Claims, 11 Drawing Sheets

Related U.S. Application Data

(60) Provisional application No. 63/131,291, filed on Dec. 28, 2020.

(51) Int. Cl.
- *G06F 13/16* (2006.01)
- *G11C 7/22* (2006.01)
- *G11C 11/4093* (2006.01)
- *G11C 29/02* (2006.01)
- *G11C 29/10* (2006.01)

(52) U.S. Cl.
CPC ............ *G11C 7/22* (2013.01); *G11C 11/4093* (2013.01); *G11C 29/022* (2013.01); *G11C 29/028* (2013.01); *G11C 29/10* (2013.01)

(56) References Cited

U.S. PATENT DOCUMENTS

| | | |
|---|---|---|
| 8,089,824 B2 | 1/2012 | Shaeffer et al. |
| 8,103,898 B2 | 1/2012 | Dimitriu et al. |
| 9,229,470 B2 | 1/2016 | Ware |
| 9,607,672 B2 | 3/2017 | Lin et al. |
| 9,965,409 B2 | 5/2018 | Hsu et al. |
| 10,491,238 B2 | 11/2019 | Sudhakaran et al. |
| 2008/0098251 A1 | 4/2008 | Naujokat |
| 2010/0118627 A1 | 5/2010 | Best |
| 2010/0146321 A1 | 6/2010 | Stark |
| 2019/0088295 A1 | 3/2019 | Shaeffer et al. |
| 2022/0206717 A1 | 6/2022 | Kim et al. |

OTHER PUBLICATIONS

"International Search Report and Written Opinion", Application No. PCT/US2021/065330, Mar. 31, 2022, 11 pages.

"Notice of Allowance", U.S. Appl. No. 17/562,560, filed Sep. 22, 2023, 8 pages.

* cited by examiner

PROGRAMMABLE MEMORY TIMING

RELATED APPLICATION(S)

This application is a continuation of and claims priority to U.S. patent application Ser. No. 17/562,560, filed Dec. 27, 2021, which claims the benefit of priority under 35 U.S.C. § 119(e) to U.S. Provisional Patent Application 63/131,291, filed on 28 Dec. 2020, the disclosures of which are incorporated herein by reference in their entirety.

BACKGROUND

Computers, smartphones, and other electronic devices operate using processors and memories. A processor executes code based on data to run applications and provide features to a user. The processor obtains the code and the data from a memory that can store information. Thus, like a processor's speed or number of cores, a memory's characteristics can impact the performance of an electronic device. Different types of memory have different characteristics. Memory types include volatile memory and nonvolatile memory, such as random-access memory (RAM) and flash memory, respectively. RAM can include static RAM (SRAM) and dynamic RAM (DRAM).

Demands on the different types of memory continue to evolve and grow. For example, as processors are engineered to execute code faster, such processors can benefit from accessing memories more quickly. Applications may also operate on ever-larger data sets that use ever-larger memories. Due to battery-powered electronic devices and power-hungry data centers, energy-usage constraints are becoming more prevalent for memory systems. Further, manufacturers may seek smaller memories as the form factors of portable electronic device continue to shrink. Accommodating these various demands is complicated by the diverse strengths and capabilities of different types of memories.

BRIEF DESCRIPTION OF THE DRAWINGS

Apparatuses of and techniques for programmable memory timing are described with reference to the following drawings. The same numbers are used throughout the drawings to reference like features and components:

FIG. 3-1 illustrates examples of an interconnect, a host device, and a memory device that can implement aspects of programmable memory timing, including by communicating a command indicative of a phase offset;

FIG. 3-2 illustrates additional examples of an interconnect, a host device, and a memory device that can implement aspects of programmable memory timing, including by activating one or more phase offset circuits for communicating data signals based on a command;

FIG. 3-3 illustrates examples of data signals propagating over an interconnect between a host device and a memory device to implement aspects of programmable memory timing;

DETAILED DESCRIPTION

Overview

Figure 1:
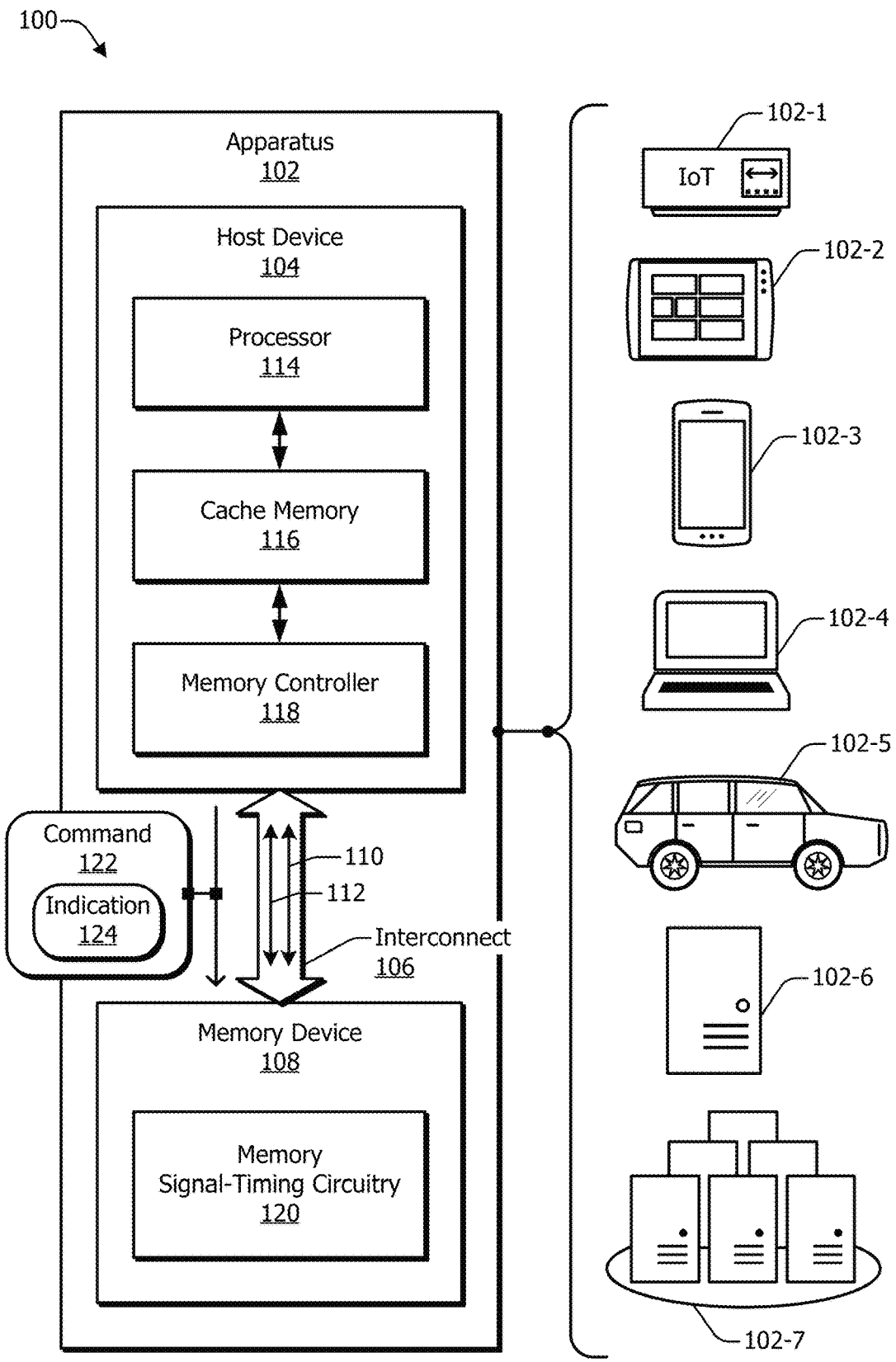
FIG. 1 illustrates example apparatuses that can implement programmable memory timing.

Computing systems can include a host device and a memory device. In some cases, the host device includes a processor and a memory controller, and the memory device includes a memory array to store data and other information. The memory controller can interact with the memory device to cause the memory device to hold information on behalf of the processor, perhaps many gigabytes of information that is stored in RAM. The memory controller communicates with the memory device via an interconnect that couples the host device to the memory device. For example, the memory controller can send commands to the memory device over the interconnect. Commands can relate to read operations to store data in the memory array and to write operations to retrieve data from the memory array. Commands can also direct the memory device to operate in a particular manner, engage a certain mode, or activate some functionality.

The interconnect can include multiple data lines that extend between the host device and the memory device. The memory controller and the memory device can, therefore, transmit data at least partly in parallel by transmitting multiple bits over the multiple data lines. The parallel transmission, or at least partially simultaneous transmission, increases the rate of data transfer between the devices, which can increase the performance of the computing system. The parallel transmission over the multiple data lines can, however, create challenges. Assume, for example, that the multiple data lines are proximate one another on a printed circuit board (PCB) or other substrate that is associated with one or more intrinsic permittivities (C r). These permittivities can affect simultaneous switching output (SSO) noise and crosstalk, which can adversely impact signal propagation along the multiple data lines. For instance, SSO noise and crosstalk can interfere with data being transmitted between the host and memory devices such that data is not accurately received at a destination device. To compound these issues, available real estate for the conductive traces on PCBs and the associated circuits is ever shrinking, which can complicate potential strategies for mitigating SSO noise and crosstalk. Further, the impact of SSO noise and crosstalk can vary by system design because the length, spacing, layout, materials, and other physical characteristics can vary. This document addresses these and other challenges as described herein.

In some situations, data that is transmitted over multiple data lines can be adjusted to reduce SSO noise and crosstalk between two or more data lines. Generally, adjacent or proximate data lines along the interconnect may have an increased susceptibility to SSO noise and crosstalk with respect to each other. To communicate along the interconnect, a device transmits respective data signals along respective ones of the multiple data lines of the interconnect. The data signals can be transmitted substantially simultaneously from one device toward another device as part of a parallel transmission, such as if eight bits are propagated on an interconnect with eight data lines.

Consider, for example, an origin device transmitting toward a destination device two pulses as two data signals onto two adjacent data lines of an interconnect. As the pulses travel along the two adjacent data lines, the two pulses can mutually interfere with each other electromagnetically. The interference can be sufficiently great that the destination device is unable to properly interpret the pulses. This is especially relevant as the transmission frequency of the pulses increases, which is what occurs when communication frequencies are increased to increase data rates. If, however, the origin device transmits the pulses at different times, the mutual interference can be appreciably reduced. This document describes approaches to transmitting pulses and other types of signal modulation at different times by using phase offsets.

In some implementations, the origin and destination devices can generate phase offsets for data signals by delaying a portion of the data signals relative to another portion using one or more delay circuits. The origin device can transmit multiple data signals using a first set of phase offsets. For instance, first, third, fifth, and seventh data signals may be delayed to create phase offsets on these four data signals. The second, fourth, sixth, and eighth data signals are thus transmitted relatively earlier. To properly receive or process the data signals, the destination device implements a second set of phase offsets, which is an inverse of the first set. In this example, the destination device therefore delays the second, fourth, sixth, and eighth data signals to align them with the other four data signals that are delayed by the origin device. Although this example has phase offsets that alternate across the eight data signals, other phase offset patterns can be used. Moreover, another phase offset pattern may reduce interference better than this example alternating pattern. Accordingly, optimum results may not be obtained by employing a default phase offset pattern across multiple data signals for all origin or destination devices.

In some cases, a superior, or optimum, pattern of phase offsets varies in different environments or circumstances. The variability may arise from many different factors. These factors can include those related to a physicality of a computing system, like the length, width, or course (e.g., straight, meandering, or number of angles/turns) of one or more traces that form the multiple data lines of the interconnect. Other factors may include transmission frequency, number of traces, PCB layout, other potentially interfering chips or circuitry, and so forth. In short, to better utilize relative phase offsets between two or more data signals to increase communication signaling performance, the phase offsets can be tailored to a given apparatus.

Continuing with a host device and memory device environment, a memory controller of the host device can be implemented to control a pattern of phase offsets for data signaling along an interconnect between the host device and the memory device. To do so, the memory controller can transmit a command to the memory device with the command indicative of at least one phase offset between two or more data signals propagated over two or more data lines of the interconnect. For example, a command can specify an offset for a first data line of multiple data lines relative to a second data line of the multiple data lines. Thus, the command may establish a pattern of phase offsets across the multiple data lines of the interconnect. The patterns or sets of phase offsets can be inverted between the host and memory devices.

In certain implementations, the memory device includes at least one register that maps commands to patterns of phase offsets across the multiple data lines of the interconnect. The memory device maps a received command to the corresponding pattern of phase offsets using an entry of multiple entries of the register. Because directionality of communication can impact SSO noise and crosstalk, the memory device can include two registers—one for read operations and one for write operations. During a write operation, the host device may phase offset or delay the write data transmitted on a portion of the data lines, and the memory device can "de-offset" the write data during receipt of the write data by delaying the data signals on the inverse or complementary data lines to realign the data signals. During a memory read operation, the memory device may phase offset read data transmitted on a portion of the data lines, and the host device may de-offset the read data by delaying the inverse data lines to realign the read data received from the memory device on the multiple data lines. To support coordinating phase offset patterns on both sides of the interconnect, including establishing inverse signal delays on opposite sides of the interconnect, the host device may also have at least one register to specify phase offset patterns.

In operation generally, any number of commands may be employed to adjust multiphase communications across the multiple data lines of an interconnect. The commands that are issued by the memory controller to the memory device may change throughout operation of the system to facilitate signal integrity. In other words, the phase offset patterns may be adjusted as environmental conditions, such as temperature or frequency, change. As an example, high noise operations may warrant increased phase offset distances between two or more of the data lines. Indications of such circumstances may be received from the processor or another device, such as a sensor. In some cases, the memory controller can use one or more commands to activate multiphase communication across the two or more data lines of the multiple data lines of an interconnect as a communication frequency on the interconnect increases to improve reliability. Similarly, as the communication frequency on the interconnect decreases, the memory controller can issue one or more commands to deactivate the multiphase communication to save power. An appropriate frequency for activation/deactivation may be established as a default or determined through experimentation.

As described above, an optimum or superior phase offset pattern may vary by system design, by manufactured device, or even over time for a single device. To accommodate this variability, the host device, such as the memory controller thereof, can determine a current phase offset pattern for use via testing. To perform the testing, the memory controller can transmit write data or receive read data using different phase offset patterns. The communications can be performed with different data values and at different transmission frequencies. The memory controller can select a phase offset pattern that meets at least one threshold, that performs superiorly over other phase offset patterns according to at least one criterion, and so forth. For instance, error may be calculated for each command associated with the phase offsets to determine the best available performance and the associated conditions. As another example, the memory controller may cycle through the available phase offset commands, or a portion thereof, with a predetermined data set during specific operating modes and operating conditions to determine an optimal command selection. The memory controller then adopts the selected phase offset pattern and transmits to the memory device a command mapping to the selected phase offset pattern in a register at the memory device.

In example implementations, phase offsets may be achieved using a clock tree that routes different clock signals to latches holding or exposed to the data signals. The clock signals can trigger the latching or the releasing and forwarding of the data signals at different times to realize transmission and reception according to different phase offsets. As such, data may be transmitted according to a selected clock signal, having a clock phase or clock phase offset, of the clock tree for each respective data line. In other implementations, components having fundamental behaviors (e.g., resistors, capacitors, or inductors) can be used to create signal delays.

This document therefore describes examples of programmable memory timing. Relative phase offsets between two or more data signals can be implemented across multiple data lines of an interconnect. The interconnect can couple a host device to a memory device. In the described manners, the host device can access the memory device more reliably and at higher rates of speed than without employing programmable memory timing. A memory device can be installed and used in different systems and under different operating conditions with higher performance due to the phase offset tailoring that can be provided by the host device as described herein. Accordingly, access times and power usage can be reduced while increasing the performance of user applications. These are but a few examples of how the described techniques and devices may be used to improve the signal integrity of data transmitted between an origin device and a destination device, other examples and implementations of which are described throughout the document. This document now turns to an example operating environment, after which example devices, methods, and systems are described.

Example Operating Environments

FIG. 1 illustrates, at 100 generally, example apparatuses 102 that can implement programmable memory timing. The apparatus 102 can be realized as, for example, at least one electronic device. Example electronic-device implementations include an internet-of-things (IoTs) device 102-1, a tablet device 102-2, a smartphone 102-3, a notebook computer 102-4 (or desktop computer), a passenger vehicle 102-5, a server computer 102-6, a server cluster 102-7 that may be part of cloud computing infrastructure or a data center, and a portion of such devices (e.g., a printed circuit board (PCB)). Other examples of the apparatus 102 include a wearable device, such as a smartwatch or intelligent glasses; an entertainment device, such as a set-top box, a smart television, or a gaming device; a motherboard or server blade; a consumer appliance; a vehicle or drone, or the electronic components thereof; industrial equipment; a security or other sensor device; and so forth. Each type of electronic device or other apparatus can include one or more components to provide some computing functionality or feature.

In example implementations, the apparatus 102 can include at least one host device 104, at least one interconnect 106, and at least one memory device 108. The host device 104 can include at least one processor 114, at least one cache memory 116, and at least one memory controller 118. The interconnect 106 can include at least one command and address bus 110 and at least one data bus 112. Each bus may be implemented as a unidirectional bus or a bidirectional bus. The interconnect 106 may also include a clock bus that is part of or separate from the command and address bus 110.

The memory device 108 may be realized, for example, with a dynamic random-access memory (DRAM) device or module, including with a three-dimensional (3D) stacked DRAM device, such as a high bandwidth memory (HBM) device or a hybrid memory cube (HMC) device.

Regarding the host device 104, the processor 114 is communicatively coupled to the cache memory 116, and the cache memory 116 is communicatively coupled to the memory controller 118. The processor 114 is also communicatively coupled, directly or indirectly, to the memory controller 118. The host device 104 may include other components to form, for instance, a system-on-a-chip (SoC). The processor 114 may include or comprise a general-purpose processor, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), an SoC, and so forth. In operation, the memory controller 118 can provide a high-level or logical interface between the processor 114 and at least one memory (e.g., a memory that is external to the host device 104 like the memory device 108). The memory controller 118 can, for example, receive memory requests from the processor 114 and provide the memory requests to the external memory with appropriate formatting, timing, reordering, and so forth. The memory controller 118 can also forward to the processor 114 responses to the memory requests that are received from the external memory.

Regarding connections that are external to the host device 104, the host device 104 is communicatively coupled to the memory device 108 via the interconnect 106. The depicted interconnect 106, as well as other interconnects (not shown) that communicatively couple together various components, enable commands and data to be transferred between two or more ones of the various components. Interconnect examples include a bus, a switching fabric, one or more wires that carry voltage or current signals, and so forth.

In example implementations for programmable memory timing, the memory device 108 includes memory signal-timing circuitry 120. The memory signal-timing circuitry 120 enables the memory device 108 to transmit data or receive data using one or more phase offsets. During data communication signaling, one or more signals propagated over the data bus 112 on various data lines can have at least one phase offset that differs from that of at least one other signal propagating over the data bus 112. To enable the host device 104, or the memory controller 118 thereof, to customize or otherwise control the phase offsets, the host device 104 can instruct the memory device 108 to use particular phase offsets or a pattern of phase offsets across the data lines of the data bus 112.

To do so, the host device 104 transmits a command 122 to the memory device 108. Thus, the memory device 108 receives the command 122 from the host device 104 over the interconnect 106. The command 122 comprises or includes at least one indication 124 of a phase offset for a first data line of multiple data lines relative to a second data line of the multiple data lines of the data bus 112. The memory signal-timing circuitry 120 establishes one or more delays for communicating data signals over the data bus 112 based on the at least one indication 124. The memory signal-timing circuitry 120 can include a respective phase offset circuit (e.g., delay circuit) for each data line of at least a portion of the multiple data lines of the data bus 112. The phase offset circuit can delay a data signal that is being transmitted or received relative to another data signal on the data bus 112.

The memory signal-timing circuitry 120 can therefore implement delays to realize phase offsets for data signals the memory device 108 is transmitting over the data lines.

Similarly, the memory signal-timing circuitry 120 can "remove" one or more relative phase offsets to align data signals that are received from the host device 104 by the memory device 108. To align the data signals, the memory signal-timing circuitry 120 can delay those data signals that are not delayed by the memory controller 118 of the host device. Thus, the host device 104 and the memory device 108 implement reciprocal or inverse delays or phase offsets relative to each other. In other words, if the host device 104 activates delays on one-half of the multiple data lines for a transmission to the memory device 108, then the memory device 108 activates delays on the other half of the multiple data lines for a reception to remove the relative offsets and realign the data signals across the data bus 112. Causing the relative phase offsets to be present during signal propagation over the interconnect 106 can reduce SSO or crosstalk between data lines to improve signaling quality, including at higher frequencies. These and other implementations are described further below, starting with reference to FIG. 3-1.

The depicted components of the apparatus 102 represent an example computing architecture with a hierarchical memory system. A hierarchical memory system may include memories at different levels, with each level having a memory with a different speed or capacity. As shown, the cache memory 116 may be logically coupled between the processor 114 and the memory device 108. Although not shown, the hierarchical memory system may include other memories or hierarchical levels. For example, the apparatus 102 may include a cache memory that is coupled between the host device 104 and the memory device 108, may include storage memory that is coupled "below" the memory device 108, and so forth.

Although various implementations of the apparatus 102 are depicted in FIG. 1 and described herein, an apparatus 102 can be implemented in alternative manners. For example, the host device 104 may include multiple cache memories, including multiple levels of cache memory, or may have no cache memory. In some cases, the host device 104 may omit the processor 114 or the cache memory 116. Also, another memory may have a respective "internal" or "local" cache memory (not shown). Further, the host device 104 may be coupled to multiple memory devices 108. Generally, the illustrated and described components may be implemented in alternative ways, including in distributed or shared memory systems. A given apparatus 102 may also include more, fewer, or different components.

The host device 104 and the various memories may be realized in multiple manners. In some cases, the host device 104 and the memory device 108 can both be disposed on, or physically supported by, a same printed circuit board (PCB) (e.g., a rigid or flexible motherboard). The host device 104 and the memory device 108 may additionally be integrated on a same IC or fabricated on separate ICs but packaged together. A memory may also be communicatively coupled to multiple host devices 104 via one or more interconnects 106 and may be able to respond to memory requests from two or more of the host devices. Each host device 104 may include a respective memory controller 118, or multiple host devices 104 may share a common memory controller 118. An example architecture with at least one host device 104 and multiple processors that are communicatively coupled to a memory device 108 is described next.

Figure 2:
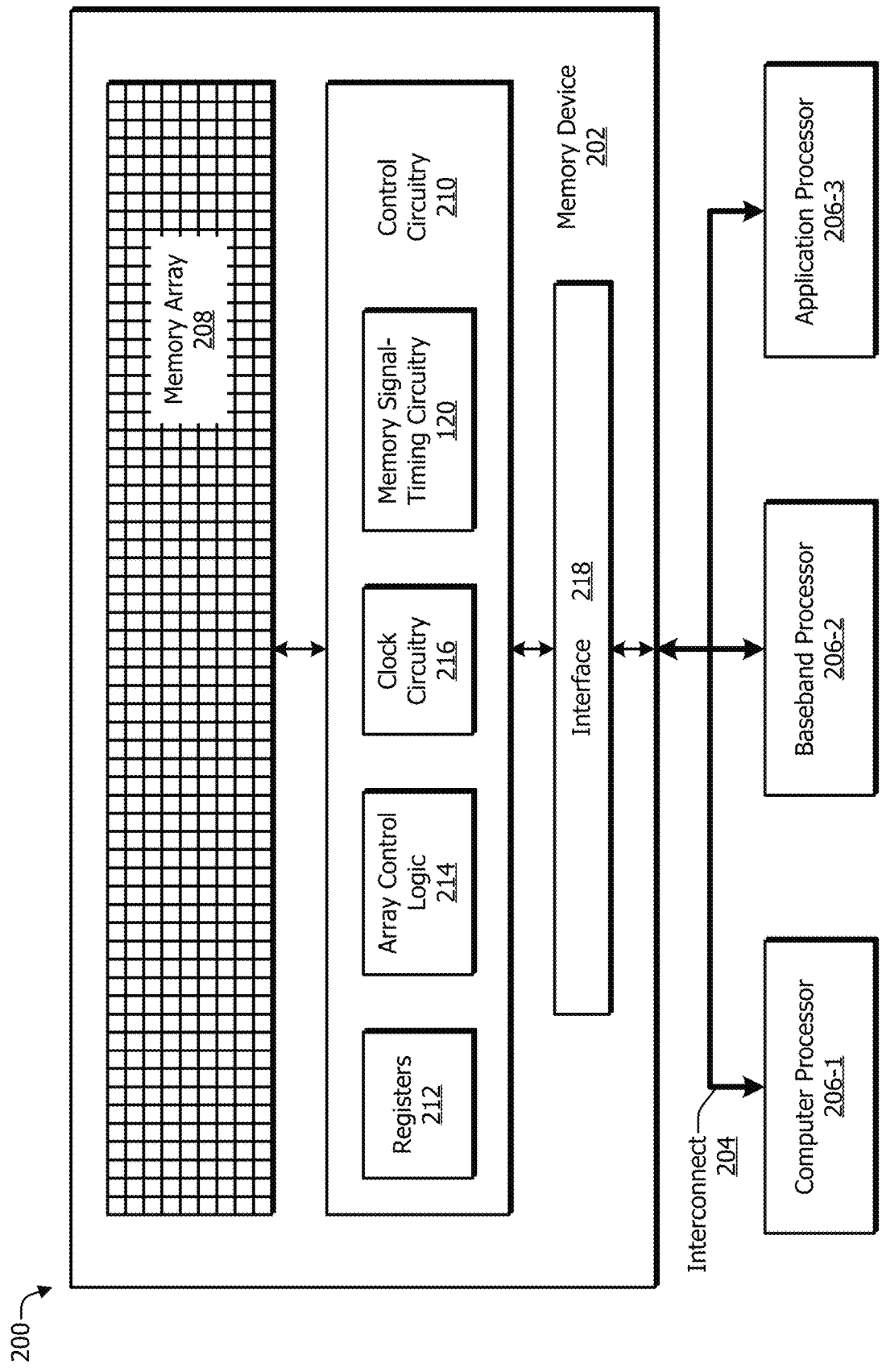
FIG. 2 illustrates example computing systems that can implement aspects of programmable memory timing.

FIG. 2 illustrates an example computing system 200 that can implement aspects of programmable memory timing. In some implementations, the computing system 200 includes at least one memory device 202, at least one interconnect 204, and at least one processor 206. The memory device 202 can include, or be associated with, at least one memory array 208, at least one interface 218, and control circuitry 210 that is communicatively coupled to the memory array 208. The memory device 202 can correspond to the cache memory 116, the memory device 108, storage memory (not shown), and so forth. Thus, the memory array 208 can include an array of memory cells, including but not limited to memory cells of Dynamic Random-Access Memory (DRAM), Synchronous DRAM (SDRAM), three-dimensional (3D) stacked DRAM, Double Data Rate (DDR) memory, or Low-Power DDR (LPDDR) SDRAM. The memory array 208 and the control circuitry 210 may be components on a single semiconductor die or on separate semiconductor dies. The memory array 208 or the control circuitry 210 may also be distributed across multiple dies.

The control circuitry 210, which may include logic circuitry, can include any of a number of components that can be used by the memory device 202 to perform various operations (e.g., communicate with other devices, manage performance, and perform memory read or write operations). For example, the control circuitry 210 can include one or more registers 212, at least one instance of array control logic 214, and clock circuitry 216. The registers 212 may be implemented, for example, as one or more registers that can store information to be used by the control circuitry 210 or another part of the memory device 202. The array control logic 214 may be implemented as circuitry that can provide command decoding, address decoding, input/output functions, amplification circuitry, power supply management, power control modes, and other functions. The clock circuitry 216 may be implemented as circuitry that can provide synchronization of various components of the memory device 202 with one or more external clock signals that may be provided over the interconnect 204, such as a command/address clock (e.g., CK_t or CK_c) or a data clock (e.g., WCK_t or WCK_c), and/or with at least one clock signal that is generated internally.

The interface 218 can couple the control circuitry 210 or the memory array 208 directly or indirectly to the interconnect 204. As shown in FIG. 2, the registers 212, the array control logic 214, and the clock circuitry 216 can be part of a single component (e.g., the control circuitry 210). In other implementations, one or more of the registers 212, the array control logic 214, or the clock circuitry 216 may be implemented as separate components, which can be provided on a single semiconductor die or disposed across multiple semiconductor dies. These components of the control circuitry 210 may be individually or jointly coupled to the interconnect 204 via the interface 218.

The interconnect 204 may be implemented with any one or more of a variety of interconnects that communicatively couple together various components and enable commands, addresses, and/or other information and data to be transferred between two or more of the various components (e.g., between the memory device 202 and the one or more processors 206). For example, the interconnect 204 may be realized as the interconnect 106 described with reference to FIG. 1 or may be implemented in a manner similar to the interconnect 106. Although the interconnect 204 is represented with a single arrow in FIG. 2, the interconnect 204 may include a bus, a switching fabric, one or more wires or traces that carry voltage or current signals, at least one switch, one or more buffers, and so forth. Further, the interconnect 204 may be separated into at least a command-and-address (CA) bus and a data bus (as depicted in FIG. 1).

In some aspects, the memory device 202 may be realized as a "separate" physical component relative to that of the host device 104 of FIG. 1 or any of the processors 206. Examples of physical components for the memory device 202, which may be separate from the host 104, include: a printed circuit board (PCB), which can be rigid or flexible; a memory card; a memory stick; a memory module, including a single in-line memory module (SIMM) or a dual in-line memory module (DIMM); and so forth. Alternatively, the memory device 202 may be packaged or integrated with other physical components, including the host device 104 or a processor 206, such as by being combined on a common PCB or together in a single device package.

The apparatuses and methods that are described herein may be appropriate for memory that is designed for lower power operations or that is targeted for energy-efficient applications. Thus, the described principles may be incorporated into a low-power memory device or a memory controller that communicates with such a low-power memory device. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. Some terminology in this document may draw from one or more of these standards or versions thereof, like the LPDDR5 standard, for clarity. The described principles, however, are also applicable to memories that comport with other standards, including other LPDDR standards (e.g., earlier versions or future versions like LPDDR6), and to memories that do not adhere to a public standard.

As shown in FIG. 2, the one or more processors 206 may include a computer processor 206-1, a baseband processor 206-2, and/or an application processor 206-3. These processors may be coupled to the memory device 202 through the interconnect 204. The processors 206 may each be a CPU, a GPU, an SoC, an ASIC, an FPGA, or the like. In some cases, a single processor comprises multiple processing cores or other resources, each dedicated to different functions, such as modem management, applications, graphics, central processing, or the like. In some implementations, the baseband processor 206-2 may include or be coupled to a modem (not shown in FIG. 2) and may be referred to as a modem processor. The modem and/or the baseband processor 206-2 may be coupled wirelessly to a network via, for example, cellular, Wi-Fi®, Bluetooth®, near field, or another technology or protocol for wireless communication.

In some implementations, the processors 206 may be connected directly to the memory device 202 (e.g., via the interconnect 204). In other implementations, one or more of the processors may be indirectly connected to the memory device 202 (e.g., over a network connection or through one or more other devices), which indirect connection may also include the interconnect 204. Further, each processor 206 may be realized similarly to the processor 114 of FIG. 1. Accordingly, a respective processor 206 can include or be associated with a respective memory controller, like the memory controller 118 depicted in FIG. 1. Alternatively, two or more processors 206 may access the memory device 202 using a shared or system memory controller 118.

In example implementations for programmable memory timing, the control circuitry 210 can include the memory signal-timing circuitry 120. Accordingly, the control circuitry 210 can include one or more phase offset (e.g., delay) circuits to create or indirectly remove (e.g., by delaying complementary/inverse data signals) at least one phase offset for a data signal across multiple data lines. The memory signal-timing circuitry 120 can process a command 122 (e.g., of FIG. 1) having at least one indication 124 of one or more phase offsets for receiving data with a write operation or for transmitting data with a read operation. The indication 124 can be mapped to at least one entry of a register included in the registers 212. These techniques are described further in the following section.

Example Techniques and Hardware

Figures 1, 3:
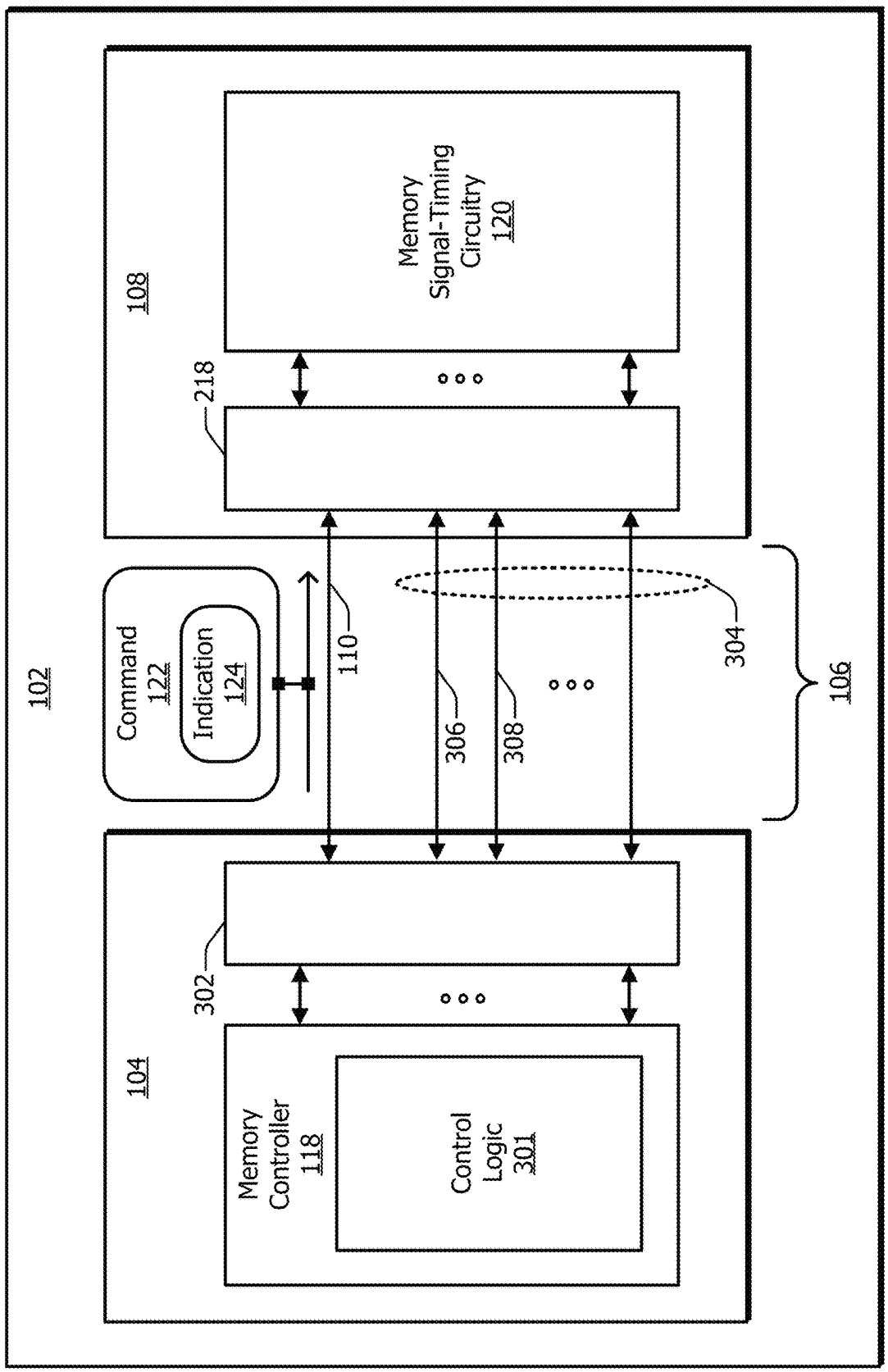
Figures 2, 3:
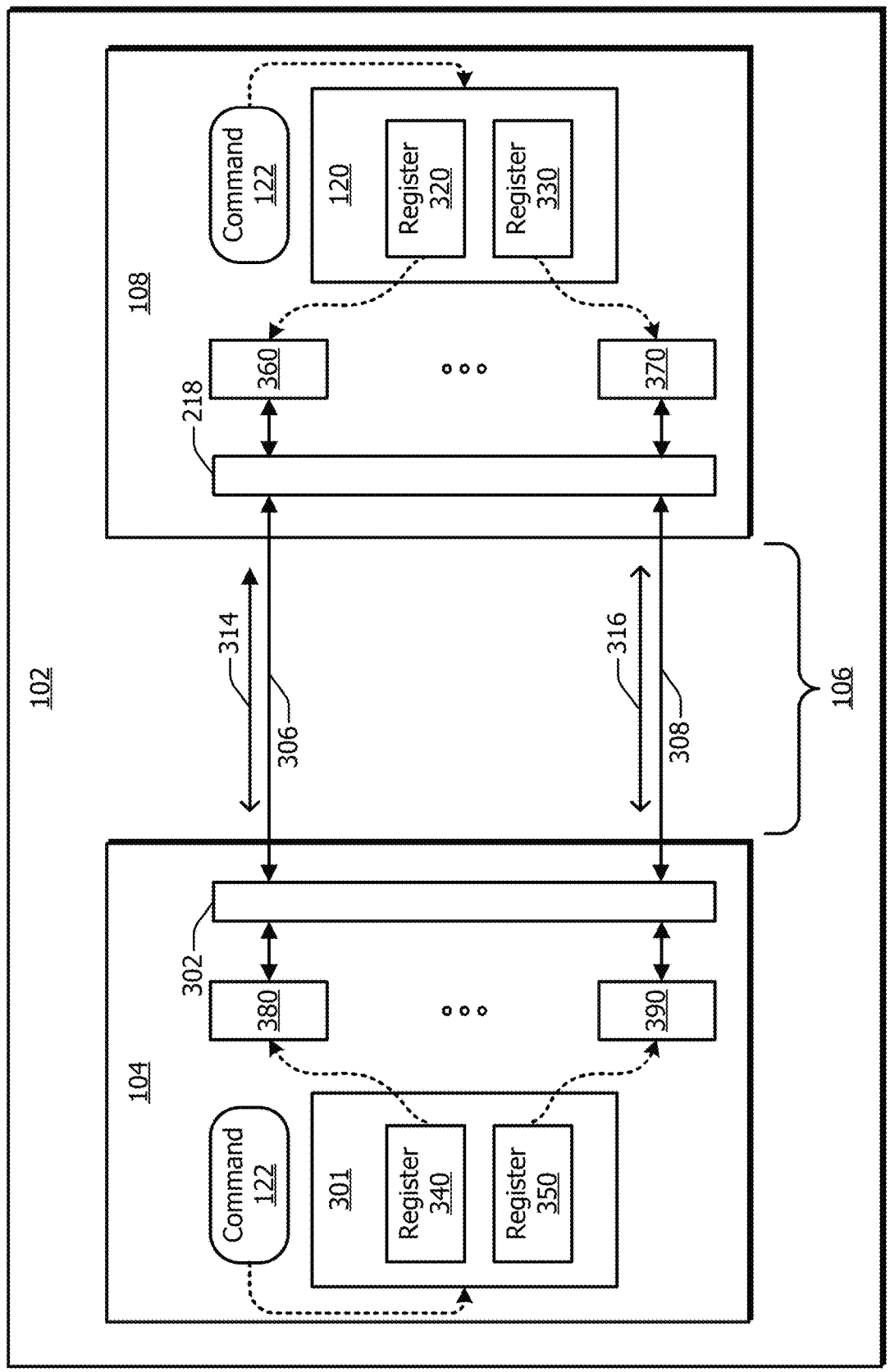
Figure 3:
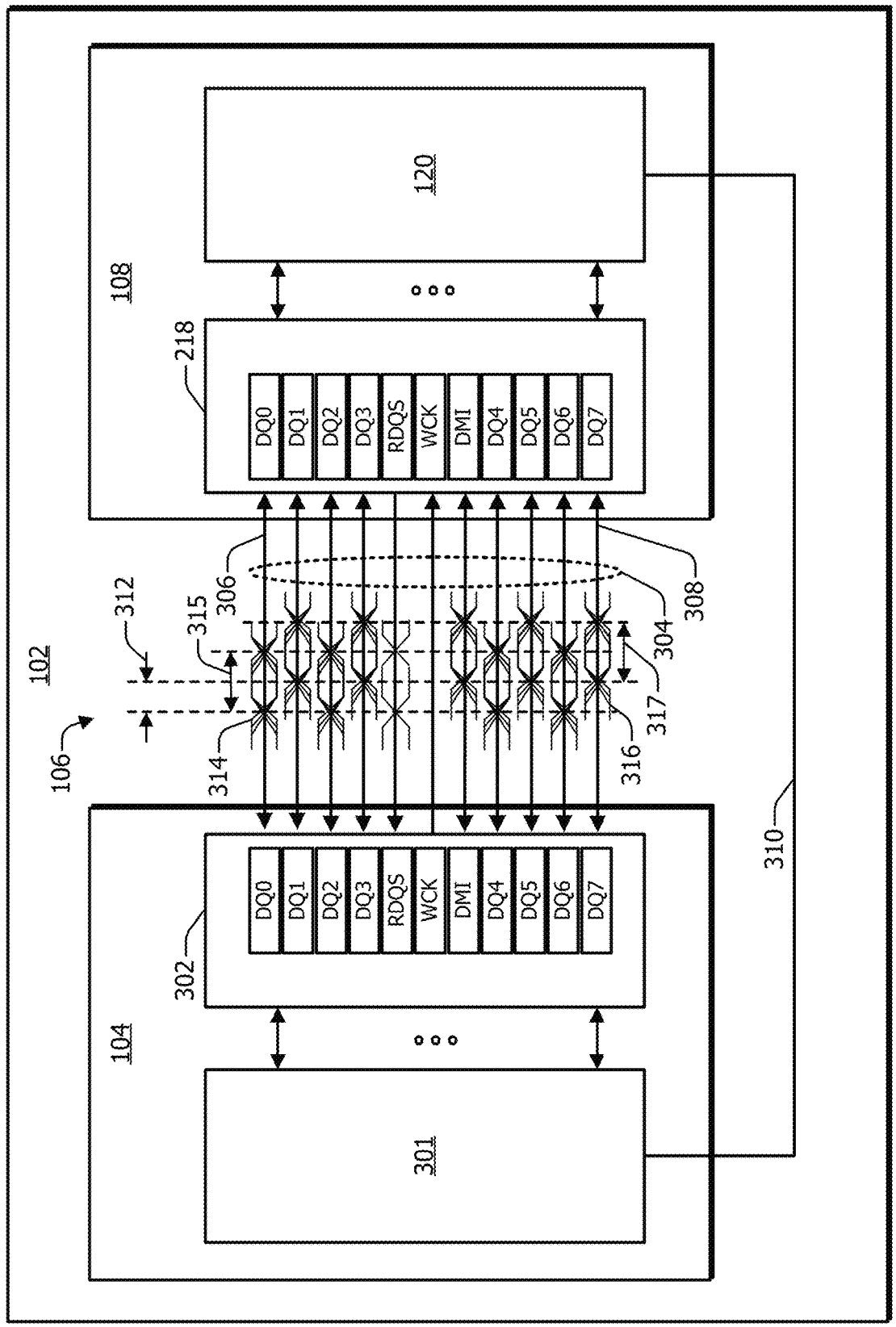

FIG. 3-1 illustrates examples of an interconnect 106, a host device 104, and a memory device 108 that can implement aspects of programmable memory timing, including by communicating a command 122 that is indicative of a phase offset. The host device 104, which may be realized as an SoC, can include a memory controller 118 and a host interface 302. The host interface 302 is coupled to, (e.g., in electrical communication with) an interconnect 106. The interconnect 106 includes multiple data lines 304 that provide electrical communication between the host interface 302 and the interface 218, or memory interface 218. The multiple data lines 304 include at least a first data line 306 and a second data line 308. It should be appreciated that any of the multiple data lines 304 may be referred to as a first data line 306 and a second data line 308. For example, in addition to lines that propagate data bits, the multiple data lines 304 may include a read strobe, a write clock, or a write mask. Thus, any of these lines may be dubbed a first data line 306 or a second data line 308. The data bus 112 (of FIG. 1) may include the multiple data lines 304.

In example implementations, the memory controller 118 may include host logic circuitry 301 or control logic 301. The control logic 301, which may include logic circuitry, of the memory controller 118 may be coupled to (e.g., in electrical communication with) the host interface 302. As shown, the host interface 302 can send the command 122 over the command and address bus 110. The command 122 may, however, be sent over any communication bus. The command 122 may include or otherwise comprise an indication 124. The indication 124 indicates at least one phase offset for the first data line 306 relative to the second data line 308. The indication 124 may, for instance, map to a pattern of phase offsets with a respective phase offset for a respective data line of the multiple data lines.

Thus, the memory device 108 may communicate with the host device 104 over the command and address bus 110. The memory interface 218 may receive the command 122 over the command and address bus 110. The memory device 108 can implement the indicated phase offset(s) of the command 122 for read operations or write operations, including for both. For a write operation, the memory device 108 may receive data (e.g., write data) from the memory controller 118 over the multiple data lines 304 via the memory interface 218. The memory interface 218 may send the data received over the multiple data lines 304, including over the first data line 306 and the second data line 308, to the memory signal-timing circuitry 120. For a read operation, the memory signal-timing circuitry 120 can forward data (e.g., read data) to the memory interface 218. The memory interface 218 transmits the read data to the host interface 302 over the multiple data lines 304 of the interconnect 106. The memory device 108 and the memory controller 118 can transmit data and/or receive data in accordance with selected or indicated phase offsets as described herein.

FIG. 3-2 illustrates examples of an interconnect 106, a host device 104, and a memory device 108 that can implement aspects of programmable memory timing, including by activating one or more phase offset circuits for communicating data signals based on a command. As shown, the first data signal 314 traverses, in either direction, the first data line 306 between the host interface 302 and the memory interface 218 over the interconnect 106. The second data signal 316 traverses, in either direction, the second data line 308 between the host interface 302 and the memory interface 218 over the interconnect 106. Upon receipt or transmission with the host interface 302, the first data signal 314 and the second data signal 316 may be affected by (e.g., delayed by) host phase-offset circuitry 380 and 390, respectively, of the host device 104. The host phase-offset circuitry 380 and 390 may be controlled by at least one of two registers, such as a first register 340 and a second register 350, based on the command 122. In some cases, one of the two registers 340 and 350 is for read operations, and the other is for write operations. Accordingly, each of the first and second registers 340 and 350 may control the host phase-offset circuitries 380 and 390 based on a respective block or column in a given entry, as is described below with reference to FIG. 4.

Analogously, upon receipt or transmission with the memory interface 218, the first data signal 314 and the second data signal 316 may be affected by (e.g., delayed by) memory phase-offset circuitry 360 and 370, respectively, of the memory device 108. The memory phase-offset circuitry 360 and 370 may be respectively controlled by at least one of two registers, such as a first register 320 and a second register 330, based on the command 122. In some cases, one of the two registers 320 and 330 is for read operations, and the other is for write operations. Accordingly, each of the first and second registers 320 and 330 may control the memory phase-offset circuitries 360 and 370 based on a respective block or column of a given entry, as is described below with reference to FIG. 5.

As one example, during a read operation, the memory device 108 may delay the first data signal 314 with the memory phase-offset circuitry 360 relative to the second data signal 316 to reduce crosstalk and noise between the first data signal 314 and the second data signal 316 during transit over the interconnect 106. Upon receipt, the host device 104 may delay the second data signal 316 relative to the first data signal 314 using the host phase-offset circuitry 390 to realign the first data signal 314 and the second data signal 316 for further processing. A write operation may be performed in a reciprocal manner by delaying one data signal at the host device 104 and the other data signal (of an example two data signals) at the memory device 108 to create mismatched phases during propagation to reduce interference and to reestablish matching phases at the memory device 108 to perform the write operation with the data.

FIG. 3-3 illustrates examples of data signals propagating over the interconnect 106 between the host device 104 and the memory device 108 to implement aspects of programmable memory timing. FIG. 3-3 depicts one of many possible implementations of a phase offset 312 in combination with phase-offset circuitries 360, 370, 380, and 390 (of FIG. 3-2). The phase offset 312 may be any amount represented in degrees or another measure of phases. As an example, and with respect to the first data line 306, the phase offset 312 may be defined based on a cycle or period of the first data signal 314. The first data signal 314 may be a square wave having a rise time and a fall time as shown. The first data signal 314 may be a differential signal.

As shown, the phase offset 312 corresponds to a delay of the second data signal 316 relative to the first data signal 314, assuming a read operation with data propagating toward the host interface 302. As such, the first data line 306 is said to have a phase offset 312 from, or relative to, the second data line 308. Generally, the phase offset 312 may be positive or negative (forward or backward) with respect to time. In some implementations, however, phase offsets are implemented as delays. An example of a memory standard that relates to low-power applications is the Low-Power Double Data Rate (LPDDR) standard for synchronous DRAM (SDRAM) as promulgated by the Joint Electron Device Engineering Council (JEDEC) Solid State Technology Association. An LPDDR SDRAM may include DQ pins in accordance with one or more versions of the standard. The DQ pins depicted in FIG. 3-3 comport with LPDDR5. Nonetheless, other implementations may have more pins, fewer pins, and/or different pins, as well as more bits, fewer bits, and/or different bits.

Figure 4:
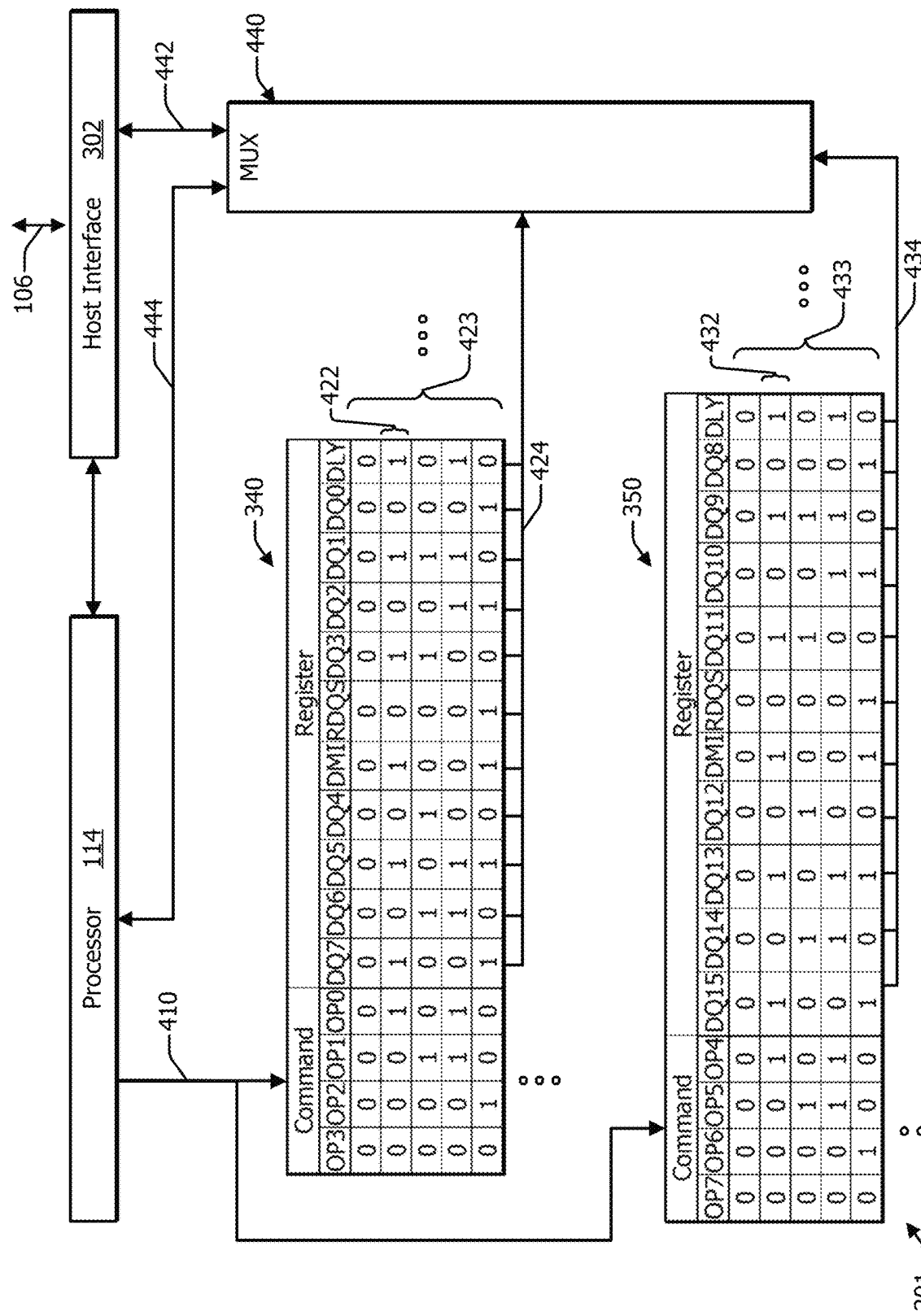
FIG. 4 illustrates an example register that a host device can use to implement aspects of programmable memory timing.
Figure 5:
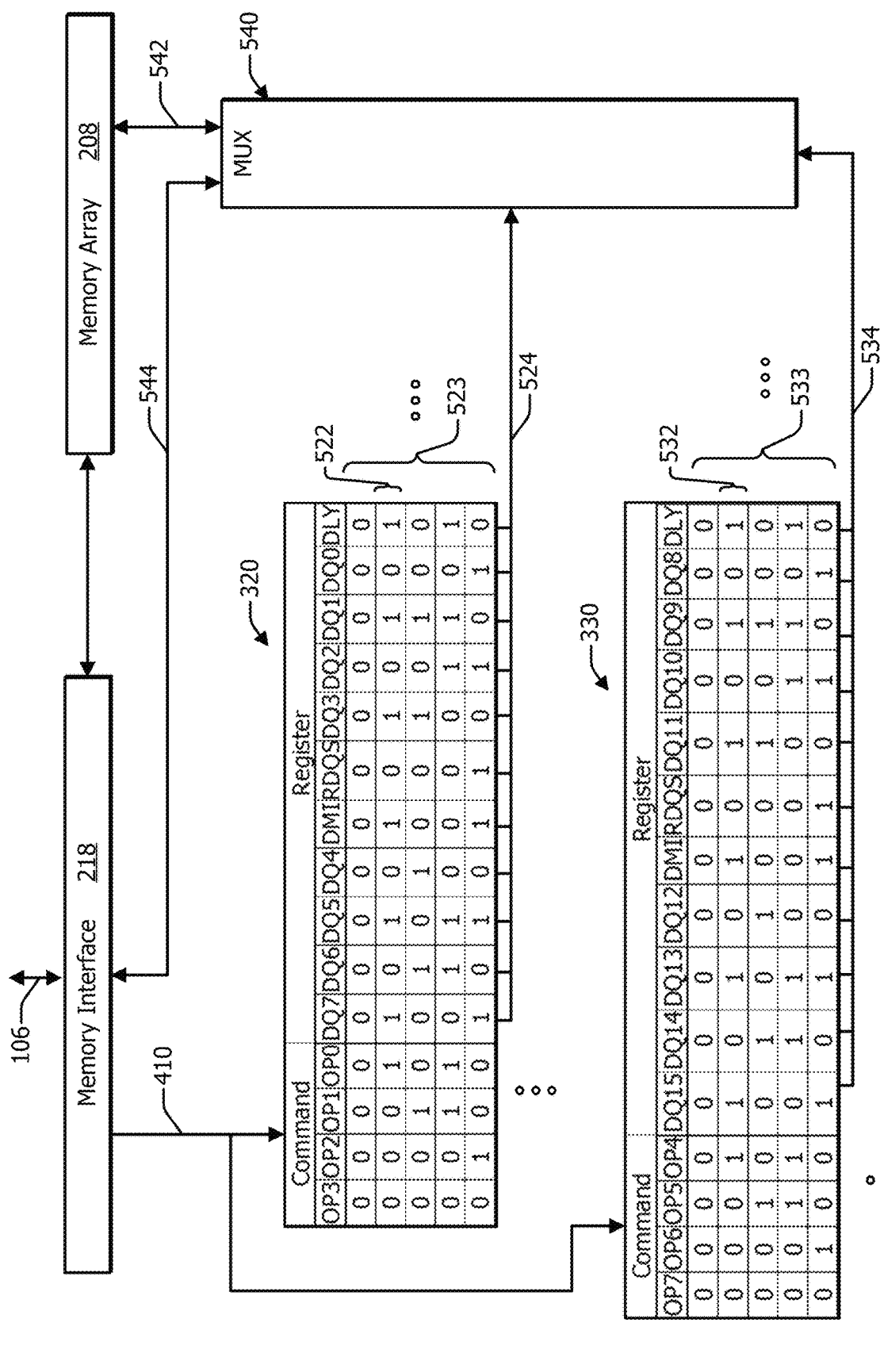
FIG. 5 illustrates an example register that a memory device can use to implement aspects of programmable memory timing.

FIG. 4 illustrates an example register that a host device 104 can use to implement aspects of programmable memory timing. FIG. 5 illustrates an example register that a memory device 108 can use to implement aspects of programmable memory timing. In FIG. 4, at least one example register that can implement aspects of programmable memory timing and a portion or aspect of the control logic 301 of memory controller 118 are shown. A command 122 (e.g., an operational command 122) may be sent from the host interface 302 to a memory device 108 (e.g., of FIG. 5). The command 122 may comprise an operational code have multiple bits. The command 122 may be any number of bits or bytes and is shown as an 8-bit command with op codes OP0 to OP7.

The command 122 can be mapped to a first register 340 (e.g., a register corresponding to lower data byte), a second register 350 (e.g., a register corresponding to an upper byte), or any combination thereof. Any number of registers 340 and 350 may be used. The registers 340 and 350 may include multiple entries 423 and 433 that are selected by the corresponding command 122. As one of many possible examples, a command 122 equal to "00010001" would correspond to entry 422 "10101010101" from the first register 340 and entry 432 "10101010101" for the second register 350. The registers as described throughout may be of any length or number, including those commensurate with current or future LPDDR standards.

As shown, the entries 422 and 432 are respectively part of multiple entries 423 and 433 of respective registers 340 and 350. These entries 422 and 432, as specified by the command 122, can be transmitted over control buses 424 and 434, respectively, and interpreted by a host multiplexor 440. The registers 340 and 350 may also include designations for the amount of delay, which may include more than one bit and designations for each data line of the multiple data lines 304. The registers 340 and 350 may further include phase offset designations for the write clock, the write mask, the read strobe, and other data lines.

The host multiplexor 440 may send or receive signals over internal host communication lines 442 and 444 to the processor 114 and the host interface 302 depending on whether the control logic 301 of the memory controller 118 is performing a read or a write command. As an example, during a read command, data is received from the host interface 302 over the internal host communication lines 442. The phase offsets 312 associated with the multiple data lines 304 are removed in the host multiplexor 440 based on the command 122, and the read data is sent to the processor 114 over the internal host communication lines 444. As another example, during a write command, data is sent from the processor 114 to the multiplexor 440 over internal host communication lines 444. The host multiplexor 440 may implement phase offsets 312 based on the command 122. The host multiplexor 440 then transmits the write data to the host interface 302 over internal host communication lines 442, and the host interface 302 transmits the write data across the interconnect 106.

Referring to FIG. 5, a similar implementation for the memory device 108 is illustrated by way of example. The command 122 is received from the host device 104 as sent by the control logic 301. The command 122 may be received over the interconnect 106 through the memory interface 218; through a private, separate, or out-of-band channel; or any combination thereof. The command 122 similarly corresponds to entries 522 and 532 in a first register 320 (e.g., corresponding to a lower byte of data) and a second register 330 (e.g., corresponding to an upper byte of data), respectively. Any number of registers 320 and 330 may be used, such as additional registers for read versus write operations.

The first and second registers 320 and 330 may include multiple entries 523 and 533 that are selected by the corresponding command 122. As one of many possible examples, a command 122 equal to "00010001" corresponds to an entry 522 "10101010101" from the first register 320 and to an entry 532 "10101010101" for the second register 330. The entries 522 and 532 are part of the multiple entries 523 and 533. These entries 522 and 532, as specified by the command 122, are transmitted over control buses 524 and 534, respectively, and interpreted by a memory multiplexor 540. The registers 320 and 330 may also include designations for the amount of delay, which may include more than one bit, and designations for each data line of the multiple data lines 304. The registers 320 and 330 may further include phase offset designations for the write clock, the write mask, the read strobe, and other data lines.

In some cases, the same command 122 may correspond to different entries for the registers 340, 350, 320, and 330. For instance, the same command may correspond to phase offsets 312 that are inverse, opposite, or reciprocal for the memory devise 108 as they are for the host device 104. As an example, a command 122 may comprise or include "00010001" that can correspond to the entry 422 "10101010101" for the host side and the entry 522 "01010101010" for the memory side. As such, the multiple data lines 304 associated with the lower-byte registers 340 and 320 are phase offset by the host multiplexor 440 and realigned by the memory multiplexor 540 based on inverse or complementary bits of the lower-byte registers 340 and 320 for a write operation. The inverse bits may denote the use of an inverse clock signal as shown in FIGS. 6-7.

Figure 6:
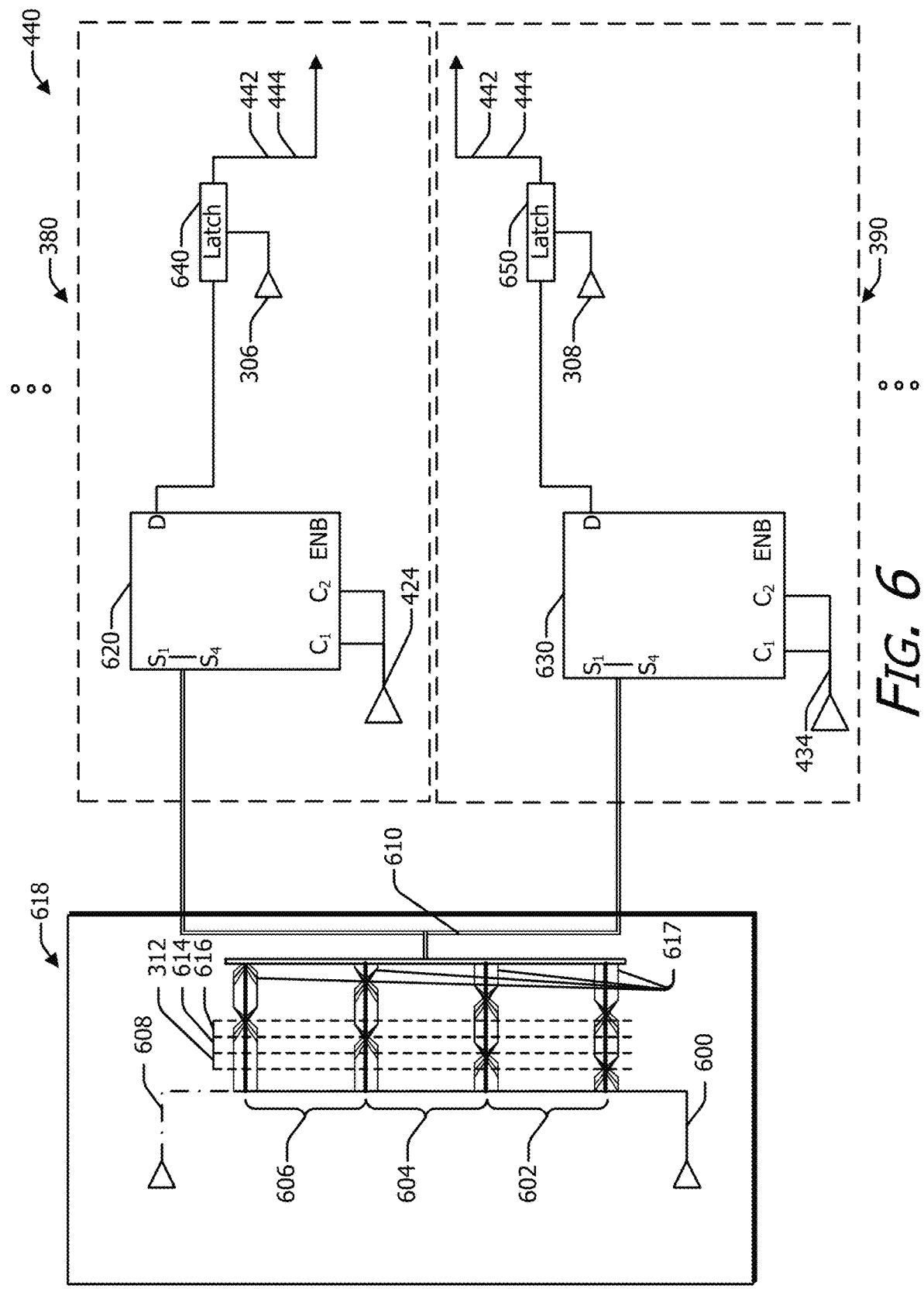
FIG. 6 illustrates an example clock tree that a host device can use to implement aspects of programmable memory timing.
Figure 7:
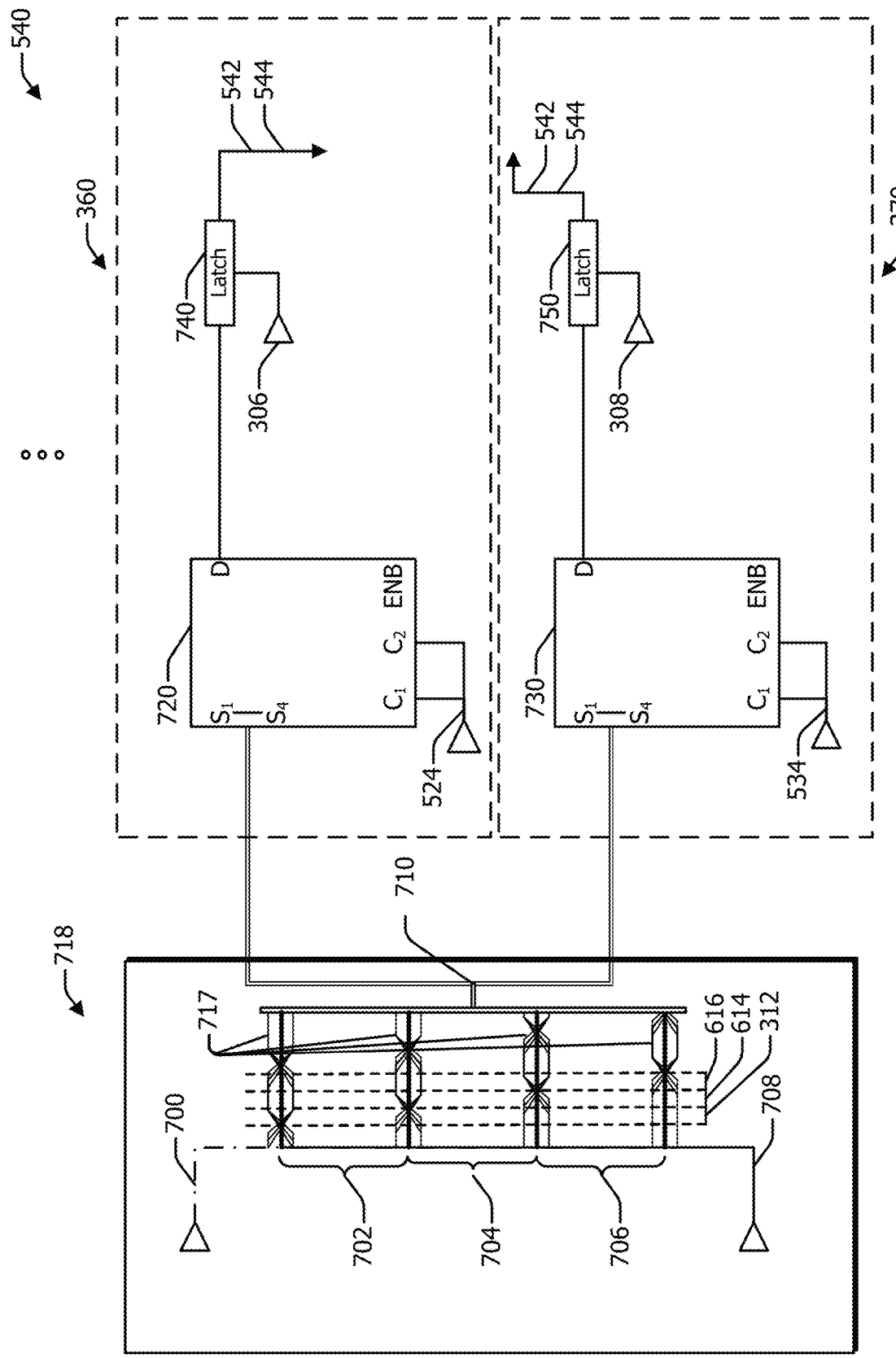
FIG. 7 illustrates an example clock tree that a memory device can use to implement aspects of programmable memory timing.

FIG. 6 illustrates an example clock tree that a host device 104 can use to implement aspects of programmable memory timing. FIG. 7 illustrates another example clock tree that a memory device 108 can use to implement aspects of programmable memory timing. Thus, FIG. 6 illustrates an example host multiplexor 440. The host multiplexor 440 and the memory multiplexor 540 (of FIGS. 5 and 7) may have the same or similar arrangements. The host multiplexor 440 includes a host clock tree 618 having clock tree circuitry. The host clock tree 618 provides a variety of clock signals according to a host clock signal 600 or an inverse host clock signal 608. Host line delays 602, 604, 606, or other delay implements may be additive and may delay the host clock signal 600 and the inverse host clock signal 608.

As shown in one example, the host line delay 602 is associated with the phase offset 312, the host line delay 604 and the host line delay 602 are associated with an additional phase offset 614. Further, the host line delay 606 and the host line delays 602 and 604 are associated with another additional phase offset 616 according to the host clock signal 600. The inverse host clock signal 608 may have the same phase as the host clock signal 600; they may even be the same signal with one produced via a multiplexor or another switching apparatus. The inverse host clock signal 608 along with the host line delay 606 can produce a complementary phase offset to phase offset 312, as can the inverse host clock signal 608 along with the host line delay 604 and the host line delay 606 to additional phase offset 614, and as can inverse clock signal 608 along with the host line delays 602, 604, and 606 to produce a complementary phase offset to the other additional phase offset 616.

The signals formed are then transmitted along multiple clock lines 610 having clock signals 617 to host clock multiplexors 620 and 630. Although two are shown for clarity, more host clock multiplexors 620 and 630 may be used. In one example, the host clock multiplexors 620 and 630 may be used for each of the multiple data lines 304 to select a clock signal from the host clock tree 618. Control bits from control buses 424 and 434 may be used to select the respective clock signals from the host clock tree 618. Two control bits are explicitly shown to select the respective clock signals; however, any number of control bits may be used with corresponding designations in registers 340 and 350. One of the control bits may correspond with the delay bit of the registers 340 and 350 to provide extended access to additional clocks.

Output from the host clock multiplexors 620 and 630 is fed to host latches 640 and 650 respectively for offsetting the phase of the first data line 306 and the second data line 308. Although the first data line 306 and the second data line 308 are shown as examples, any of the multiple data lines 304 may be similarly offset. The host latches 640 and 650 may be output to internal host communication lines 442 and 444 for write and read operations, respectively. FIG. 6 is shown in a simplified form in the interest of clarity. Any number of host clock multiplexors 620 and 630 may be used along with any number host latches 640 and 650, depending on a width of the data bus. Depending on the operation, the host latches 640 and 650 may be situated to output to any of the internal host communication lines 442 and 444 based on whether a read or write operation is performing the operation.

As an example operation, the host device 104 may issue a command 122 that delays a first data line 306 with respect to a second data line 308. Control bus 434 may select the clock signal 600 without a relative delay from line delays 602, 604, and 606 based on the command 122. Control bus 424, on the other hand, may select the host clock signal 600 with line delay 602 having a phase offset 312. As such, the latch 640 transmits data on the first data line 306 to the internal host communication lines 442 to the host interface 302 across interconnect 106 after the transmission on the second data line 308 is initiated.

Continuing with FIG. 7, an example memory multiplexor 540 is illustrated. The host multiplexor 440 and the memory multiplexor 540 may have the same or similar arrangements. The arrangements may be reciprocal to compensate for the phase delays 312, 612, and 614 produced by the other device. The memory multiplexor 540 includes a memory clock tree 718 having clock tree circuitry. The memory clock tree 718 provides a variety of clock signals according to a memory clock signal 700, which provides opposite phase offsets 312, 612, and 614, and an inverse memory clock signal 708, which provides the same phase offsets 312, 612, and 614. Memory line delays 702, 704, 706, or other delay implements may be additive and may delay the memory clock signal 700 and the inverse memory clock signal 708.

As shown in one example, the memory line delay 702 is associated with the phase offset 312, the memory line delay 704 and the memory line delay 702 are associated with an additional phase offset 614. Further, the memory line delay 706 and the memory line delays 702 and 704 are associated with another additional phase offset 616 according to the memory clock signal 700. The inverse memory clock signal 708 may have the same phase as the memory clock signal 700, for one may be derived from the other using a multiplexor or another switching apparatus. The inverse memory clock signal 708 along with the line delay 706 can produce a complementary phase offset to phase offset 312, as can inverse memory clock signal 708 along with line delay 704 and line delay 706 to additional phase offset 614, and as can inverse clock signal 708 along with line delays 702, 704, and 706 to produce complementary phase offsets to the other additional phase offset 616.

The signals formed are then transmitted along multiple clock lines 710 having clock signals 717 to memory clock multiplexors 720 and 730. Although two are shown, more memory clock multiplexors 720 and 730 may be used. In one example of many, memory clock multiplexors 720 and 730 may be used for each of the multiple data lines 304 to select a clock signal from the memory clock tree 718. Control bits from memory control buses 524 and 534 may be used to select the respective clock signals from the memory clock tree 718. Although two control bits are used to select the respective clock signals, any number of control bits may be used with corresponding designations in registers 320 and 330 (e.g., of FIG. 5). One of the control bits may correspond with the delay bit of the registers 320 and 330 to provide extended access to additional clocks.

Output from the memory clock multiplexors 720 and 730 is fed to memory latches 740 and 750 for respectively offsetting the phase of the first data line 306 and the second data line 308. Although the first data line 306 and second data line 308 are shown as examples, any of the multiple data lines 304 may be similarly offset. The memory latches 740 and 750 may be output to respective internal memory communication lines 542 and 544 for write and read operations, respectively. FIG. 7 is shown in a simplified form in the interest of clarity; thus, any number of memory clock multiplexors 720 and 730 may be used along with any number of memory latches 740 and 750.

Depending on the operation, the memory latches 740 and 750 may be situated to output to any of the respective internal memory communication lines 542 and 544 based on the applicable read or write operation being performed. As used herein, the term inverse may include any number of opposing or reciprocal output signals. As an example, if the phase offset 312 is 45° offset from the base clock signal, then the inverse, opposing, or reciprocal output signal may be −45° offset from the same base clock signal. Additionally or alternatively, if the phase offset 312 is 45° offset from the base clock signal, then the inverse, opposing or reciprocal output signal may correspond to a 45° phase offset applied to the non-delayed data lines. As such, the example circuits shown in FIGS. 4-7 can be implemented as phase offset circuits for respective data lines of the multiple data lines 304.

As an example, the host device 104 may issue a command 122 that delays a first data line 306 with respect to a second data line 308 on the host side. The control bus 524 may select the memory clock signal 700 without a relative delay from memory line delays 702, 704, and 706 based on the command 122. On the other hand, the control bus 534 may select the memory clock signal 700 with the line delay 702 having a phase offset 312 opposite of the host phase offset 312 to realign the signaling on the first data line 306 and the second data line 308. As such, the memory latch 740 can forward data received from the data line 306 via the internal memory communication line 544 and the memory interface 218 prior to the memory latch 750 receiving data from the data line 308.

It should be appreciated that first data line 306 and second data line 308 are merely depicted as examples and may be different traces on a PCB that are contiguous between the host device 104 and the memory device 108. That is, the first data line 306 may convey data between the host device 104 and the memory device 108, taking any number of stops, buffers, or detours along the way.

Example Methods

Figure 8:
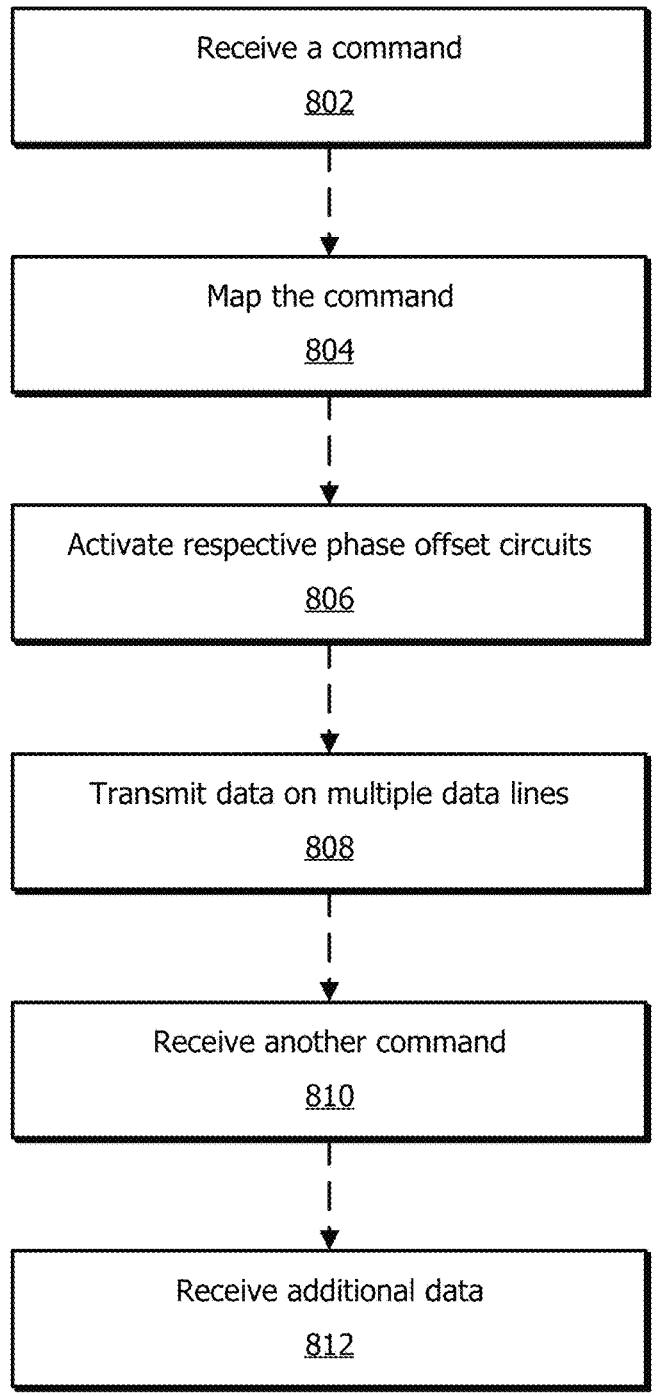
FIG. 8 illustrates an example method that can implement aspects of programmable memory timing.
Figure 9:
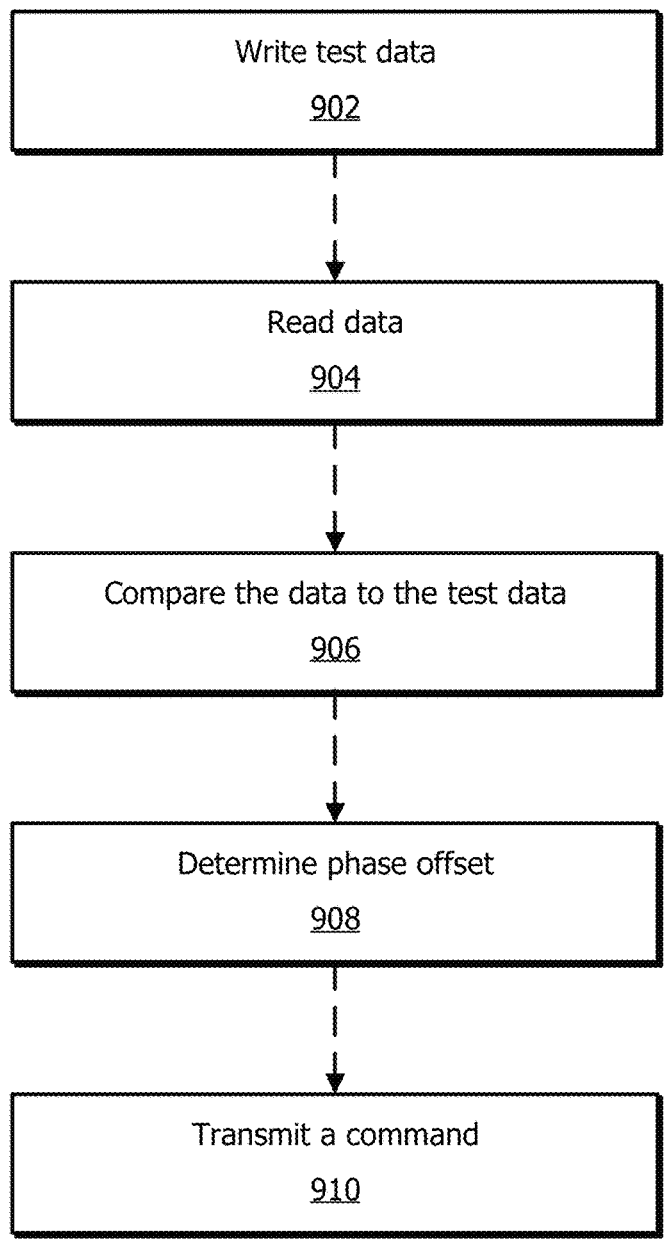
FIG. 9 illustrates another example method that can implement aspects of programmable memory timing.

This section describes example methods for programmable memory timing with reference to the flow chart(s) and flow diagram(s) of FIGS. 8 and 9. These descriptions may also refer to components, entities, and other aspects depicted in FIGS. 1-7, which reference is made only by way of example. The described methods are not necessarily limited to performance by one entity or multiple entities operating on one device.

With reference to FIG. 8, at block 802, a command 122 is received as discussed throughout this document. The command 122 may be received by any implement. For example, the command 122 may be received by a host device 104, a memory device 108, or particular circuitry included therein. The reception may be inter-chip or intra-chip. The host device 104 may, for instance, transmit the command 122 to the memory device 108. In some cases, the command 122 may include bits mappable to a register 340 or 350 and 320 or 330, corresponding respectively to entries 422, 432, 522, and 532.

At block 804, the command 122 can be mapped to an entry of multiple entries 423, 433, 523, and 533 as shown in FIGS. 4 and 5. As an example, the command 122 may comprise or include "00010001" that can correspond to the entry 422 "10101010101" and the entry 432 "10101010101" of the multiple entries 423 and 433 of the host device 104. The command 122 may also or instead comprise or include "00010001" that can correspond to the entry 522 "10101010101" and the entry 532 "10101010101" of the multiple entries 523 and 533 of the memory device 108. The mapping may occur through circuitry that applies direct logic as a lookup table (e.g., if X then Y). The mapping may additionally or alternatively implement mathematical or binary operations (e.g., if X then X). The entries 422 and 432 may be selected based on the command 122 by a multiplexor or another implement. Thus, the command 122 may serve as the control inputs of the multiplexor and the entries 423, 433, 523, and 533 serve as selectable outputs of the multiplexor. In operation, such multiplexors may be similar to the clock multiplexors 620, 630, 720, and 730.

In some cases, the command 122 may be related to a particular operation or operating situation of the memory device 108 or the host device 104. As an example, the command 122 may be associated with a read command or a write command. The command 122 may be sent in connection with the read command or the write command on the same or different data lines 304. The command 122 may include a first portion (e.g., OP0, OP1, OP2, and OP3) that relates to the lower byte (e.g., DQ0, DQ1, DQ2, DQ3, DQ4, DQ5, DQ6, and DQ7) and a second portion (e.g., OP4, OP5, OP6, and OP7) that relates to the upper byte (e.g., DQ8, DQ9, DQ10, DQ11, DQ12, DQ13, DQ14, and DQ15). The mapping may include applying the phase offset indications to the corresponding data line of the multiple data lines 304. As an example, the mapping may use a host clock tree 618 and the host clock multiplexors 620 and 630 to offset the first data line 306 from the second data line 308.

At block 806, respective phase offset circuits can be activated. An activated phase offset circuit may create a phase offset, such as by delaying propagation of a signal, on a per-data-line basis. The activation of respective phase offset circuits may be based on the command 122. The entry of a register 340, 350, 320, or 330 to which the command 122 is mapped may control which phase offset circuits are activated. This is shown for an example clock-based activation mechanism in FIGS. 6 and 7 with respect to control lines 424, 434, 524, and 534 and latches 640, 650, 740, and 750, in conjunction with associated multiplexors 620, 630, 720, and 730. Other activation mechanisms, however, can alternatively be employed.

At block 808, data, as shown in one example as data signal 316, can be transmitted across the multiple data lines 304. The data may be of any form, structure, or type and may traverse the interconnect 106 as binary voltages that designate data bits. As an example, first data line 306 propagates a first data signal 314 having a first data bit 315 with a high or low voltage. The second data line 308 propagates a second data signal 316 having a second data bit 317. As shown, the second data bit 317 is delayed with respect to the first data bit 315. In accordance with relative phase offsets, the phase offset 312 between the first data bit 315 and the second data bit 317 is interchangeable; in other words, the first data bit 315 may be delayed with respect to the second data bit 317 or vice versa. With reference to FIG. 3, the multiple data lines 304 may intersect with an SoC including the host device 104 and with the memory device 108 before conductively connecting with the host interface 302 and the memory interface 218. As such, the host device 104 or the memory device 108 may transmit data on the multiple data lines 304 based on the command 122, depending on the direction of travel as shown in block 808.

At block 810, another command can be received. As an example, the other command may be "00100010." The other command (or a second command) may be similar to the command 122. The other command may be based on changes to the operating environment of the host device 104 or the memory device 108. The other command may have the same number of bits as the command 122. It should be appreciated that any device, including the host device 104 or the memory device 108, may receive the command 122 or the other command to update a pattern of phase offsets as defined in a different entry of a register 340, 350, 320, and 330.

At block 812, additional data can be received. As an example, the first data signal 314 and the second data signal 316 may include bits that are categorized as additional data. The additional data may have phase offsets 312 different from the original or previous data of the first data signal 314 and the second data signal 316. The additional data may have phase offsets 312 that are different from the original data as defined the by the other command received at block 810. As such, the host device 104 or the memory device 108 may use the phase offset circuitry to realign or "de-offset" data on the multiple data lines 304 to receive the additional data based on the other command.

Turning to FIG. 9, a method 900 is shown. This document has discussed, in one or more examples, a command 122 that defines the relative phase offsets or phase offset pattern of the multiple data lines 304. The command 122 may be determined by a learning or training algorithm associated with the accuracy or error of data traversing the multiple data lines 304. As one example, operating conditions of the apparatus 102 may alter the signal integrity of data traversing the multiple data lines 304. For instance, a power mode or communication frequency associated with the apparatus 102 or another environmental or operating factor may cause signal integrity to change. The command 122 may be initially selected or updated based on these circumstances to maximize, or at least increase, signal integrity.

At block 902, test data can be written to the memory device 108 by the host device 104. The host device 104 may write the test data in accordance with a set of phase offsets that correspond to a command 122. At block 904, read data can be read by the host device 104 from the memory device 108. The data that is written or read may be of any type or structure. The write data may include, for instance, a string of bits generated by a random or pseudo-random function. The bits may traverse the multiple data lines 304 and be affected by SSO noise or crosstalk. The data may be read and reread by the host device 104 (e.g., sent and resent by the memory device 108) according to a second command and a third command. As an example, the second command may be an operating command having a value of "00000000." The third command may be an operating command having a value of "00010001." The testing may be conducted during initialization or manufacturing or during operation.

At block 906, the written data can be compared to the read data communicated over the multiple data lines 304 or a separate channel 310 to compute the accuracy or error associated with reading and writing under a given command 122. At least one criterion associated with the test commands may be used to determine the command 122 that indicates the phase offset pattern to be used during operation of the apparatus 102. As an example, a criterion may be an accuracy or error associated with the read data or other test data.

At block 908, a phase offset can be determined. For example, the control logic 301 of the memory controller 118 may determine a phase offset based on write data, read data, and at least one criterion with the data propagate in accordance with multiple commands 122. In some cases, a list of commands 410 and associated environmental or operating conditions may be stored on the apparatus 102 for use by the host device 104. The command 122 may be selected based on the test command having the lowest error or highest accuracy for a given operating condition. As such, a phase offset for particular data lines of the multiple data lines 304 may be determined and stored in the apparatus 102 as the command 122.

After initialization or as a phase offset update at block 910, the selected command 122 can be transmitted, intra-chip or inter-chip, to define a pattern of the phase offsets 312 for communication between the host device 104 and the memory device 108. The command 122 may be revised, updated, or issued according to testing and analysis responsive to the accuracy and error determined through the comparison.

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods may be implemented in, for example, hardware (e.g., fixed-logic circuitry or a processor in conjunction with a memory), firmware, software, or some combination thereof. The methods may be realized using one or more of the apparatuses or components shown in FIGS. 1-7, the components of which may be further divided, combined, rearranged, and so on. The devices and components of these figures generally represent hardware, such as electronic devices, packaged modules, IC chips, or circuits; firmware or the actions thereof; software; or a combination thereof. With reference to FIGS. 1-7, in some cases, a host device 104 or a memory device 108 may individually perform the operations of these methods. In other cases, a host device 104 and a memory device 108 may jointly perform the operations. FIGS. 1-7 illustrate example circuitry that may perform at least some of these operations. Thus, these figures illustrate some of the many possible systems or apparatuses capable of implementing the described methods.

Examples of multiple implementations are described below.

Example 1: A method comprising: receiving a command indicative of a phase offset for a first data line of multiple data lines relative to a second data line of the multiple data lines, the multiple data lines associated with a memory array; and transmitting data on the multiple data lines based on the command.

Example 2: The method of example 1, further comprising: mapping the command to an entry of multiple entries of a register, the entry corresponding to respective phase offset indications for respective data lines of the multiple data lines.

Example 3: The method of example 1 or example 2, further comprising: selecting the entry based on the command; and transmitting the data on the multiple data lines based on the respective phase offset indications of the entry.

Example 4: The method of any one of the preceding examples, further comprising: activating respective phase offset circuits for the respective data lines of the multiple data lines based on the respective phase offset indications corresponding to the entry.

Example 5: The method of any one of the preceding examples, further comprising: receiving the command from a host device, wherein: the command is associated with a memory read operation and comprises eight (8) bits; and the command includes a first portion relating to an upper byte of the data and a second portion relating to a lower byte of the data.

Example 6: The method of any one of the preceding examples, further comprising: receiving another command indicative of another phase offset for the first data line of the multiple data lines relative to the second data line of the multiple data lines; and receiving other data on the multiple data lines based on the other command.

Example 7: The method of any one of the preceding examples, further comprising: latching the other data from data signals, which are propagated over the multiple data lines, using one or more clock signals for individual data lines of the multiple data lines, wherein the one or more clock signals are based on other phase offset indications that correspond to the other command.

Example 8: The method of any one of the preceding examples, further comprising: receiving the other command from a host device via an interconnect that includes the multiple data lines, wherein: the other command is associated with a memory write operation and comprises eight (8) bits; and the other command includes a first portion relating to an upper byte of the other data and a second portion relating to a lower byte of the other data.

Example 9: The method of any one of the preceding examples, further comprising: transmitting second data on the second data line before first data on the first data line across multiple memory read operations based on the phase offset for the first data line as indicated by the command.

Example 10: The method of any one of the preceding examples, further comprising: transmitting a second data bit on the second data line of the multiple data lines based on the command; and delaying transmission of a first data bit on the first data line of the multiple data lines relative to the transmitting of the second data bit based on the command.

Example 11: The method of any one of the preceding examples, further comprising: starting transmission of the first data bit after starting the transmitting of the second data bit based on the command.

Example 12: The method of any one of the preceding examples, further comprising: determining a first clock signal for the first data line of the multiple data lines based on the command; and determining a second clock signal for the second data line of the multiple data lines based on the command.

Example 13: The method of any one of the preceding examples, further comprising: transmitting a first data bit on the first data line based on the first clock signal; and transmitting a second data bit on the second data line based on the second clock signal.

Example 14: A method comprising: reading, from a memory device, read data having one or more phase offsets corresponding to multiple data lines of an interconnect; determining a phase offset for a first data line of the multiple data lines relative to a second data line of the multiple data lines based on the reading; and transmitting to the memory device a command indicative of the phase offset.

Example 15: The method of example 14, further comprising: writing, to the memory device, write data; comparing the read data to the write data; and determining the phase offset based on the comparing.

Example 16: The method of example 14 or example 15, further comprising: reading first data of the read data according to an entry of multiple entries of a register defining the one or more phase offsets corresponding to the multiple data lines; reading second data of the read data according to another entry of the multiple entries of the register defining the one or more phase offsets corresponding to the multiple data lines; selecting from the entry of the multiple entries and the other entry of the multiple entries; and determining the command based on the selecting.

Example 17: The method of any one of examples 14-16, further comprising: transmitting to the memory device a first command indicative of the entry of the multiple entries prior to the reading of the first data; and transmitting to the memory device a second command indicative of the other entry of the multiple entries prior to the reading of the second data.

Example 18: The method of any one of examples 14-17, further comprising: selecting between at least the entry of the multiple entries and the other entry of the multiple entries based on at least one criterion.

Example 19: The method of any one of examples 14-18, wherein the at least one criterion relates to an accuracy of at least one of the first data or the second data relative to test data written to the memory device.

Example 20: The method of any one of examples 14-19, wherein the at least one criterion characterizes an amount of cross-talk between two or more data lines of the multiple data lines.

Example 21: A memory device comprising: an interface configured to be coupled to an interconnect including multiple data lines; a register having multiple entries, an entry of the multiple entries configured to store respective phase offset indications for respective data lines of the multiple data lines; a memory array configured to store data; and logic circuitry configured to communicate with the memory array, the register, and the interface, the logic circuitry configured to process memory operations with the respective phase offset indications based on a command, the command mapped to the entry of the multiple entries.

Example 22: The memory device of example 21, wherein: the logic circuitry comprises multiple delay circuits, respective delay circuits of the multiple delay circuits corresponding to respective data lines of the multiple data lines.

Example 23: The memory device of example 21 or example 22, wherein the logic circuitry comprises: clock tree circuitry comprising multiple clock lines corresponding to multiple phase offsets; and at least one multiplexor coupled to the multiple clock lines, the at least one multiplexor configured to output a clock signal having a phase offset corresponding to one of the respective phase offset indications based on the command.

Example 24: The memory device of any one of examples 21-23, wherein the logic circuitry comprises at least one latch configured to receive the clock signal from the at least one multiplexor and forward the data according to the clock signal.

Example 25: The memory device of any one of examples 21-24, wherein: the memory array is configured to send the data to the at least one latch; and the interface is configured to receive the data from the at least one latch.

Example 26: The memory device of any one of examples 21-25, wherein: the interface is configured to send the data to the at least one latch; and the memory array is configured to receive the data from the at least one latch.

Example 27: The memory device of any one of examples 21-26, wherein the command is indicative of a phase offset defined in the entry for a first data line of the multiple data lines relative to a second data line of the multiple data lines.

Example 28: A host device comprising: an interface configured to be coupled to an interconnect including multiple data lines; and a memory controller coupled to the interface and including control logic, the memory controller configured to perform memory operations according to different phase offsets across the multiple data lines, the control logic configured to: transmit to a memory device a command indicative of a phase offset for a first data line of the multiple data lines relative to a second data line of the multiple data lines.

Example 29: The host device of example 28, wherein: the command is indicative of a first set of phase offsets for the memory device to receive data; and the control logic is configured to transmit data to the memory device in accordance with a second set of phase offsets different from the first set of phase offsets.

Example 30: The host device of example 28 or example 29, wherein the second set of phase offsets is inverse to the first set of phase offsets.

Example 31: The host device of any one of examples 28-30, wherein the control logic is configured to: transmit a second command to the memory device to deactivate multiphase communication across two or more data lines of the multiple data lines.

Example 32: The host device of any one of examples 28-31, wherein the control logic is configured to: transmit a third command to the memory device to activate the multiphase communication across the two or more data lines of the multiple data lines.

Example 33: The host device of any one of examples 28-32, wherein the control logic is configured to: determine the phase offset for the first data line of the multiple data lines relative to the second data line of the multiple data lines.

Example 34: The host device of any one of examples 28-33, wherein the control logic is configured to: perform memory operations with multiple relative phase offsets between the first data line and the second data line to determine the phase offset.

Example 35: The host device of any one of examples 28-34, wherein the control logic comprises: clock tree circuitry including multiple clock lines having respective clock phases; and at least one multiplexor configured to receive the multiple clock lines and to output a clock signal having a clock phase offset based on the command.

Example 36: The host device of any one of examples 28-35, wherein the control logic comprises a latch configured to receive the clock signal and to output data according to the clock signal.

Example 37: The host device of any one of examples 28-36, wherein the command maps to an entry of multiple entries of a register, the entry corresponding to respective phase offset indications for respective data lines of the multiple data lines.

Example 38: The host device of any one of examples 28-37, wherein the command is indicative of at least one phase offset defined in the entry for the first data line of the multiple data lines relative to the second data line of the multiple data lines.

Example 39: The host device of any one of examples 28-38, wherein: the command is associated with a memory read operation and comprises eight (8) bits; and the command includes a first portion relating to a lower byte of data and a second portion relating to an upper byte of the data.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

CONCLUSION

Although implementations for programmable memory timing have been described in language specific to certain features and/or methods, the subject of the appended claims is not necessarily limited to the specific features or methods described. Rather, the specific features and methods are disclosed as example implementations for programmable memory timing.

What is claimed is:

1. A memory device comprising:
an interface configured to be coupled to an interconnect including multiple data lines;
a memory array configured to store data; and
logic circuitry configured to communicate with the memory array and the interface, the logic circuitry configured to:
receive the data for storage in the memory array using respective phase offset indications for respective data lines of the multiple data lines based on a command.

2. The memory device of claim 1, wherein the logic circuitry is configured to:
receive the command, the command associated with a memory write operation.

3. The memory device of claim 2, wherein:
the interconnect includes a command and address bus; and
the logic circuitry is configured to receive the command via the command and address bus.

4. The memory device of claim 2, wherein:
the command comprises at least one command; and
the at least one command includes a first portion relating to an upper byte of the data and a second portion relating to a lower byte of the data.

5. The memory device of claim 2, wherein the logic circuitry is configured to:
receive a second command, the second command associated with a memory read operation; and
transmit second data, which is stored in the memory array, using second respective phase offset indications for the respective data lines of the multiple data lines based on the second command.

6. The memory device of claim 5, wherein the respective phase offset indications corresponding to the command are different from the second respective phase offset indications corresponding to the second command.

7. The memory device of claim 2, wherein the logic circuitry is configured to:
receive the command from a memory controller of a host device via the interconnect.

8. The memory device of claim 2, wherein the logic circuitry is configured to:
remove one or more relative phase offsets of one or more data bits communicated using the multiple data lines to align multiple data signals of the multiple data lines.

9. The memory device of claim 8, wherein:
the logic circuitry includes multiple latches, each respective latch of the multiple latches coupled to a respective data line of the multiple data lines; and
the logic circuitry is configured to remove the one or more relative phase offsets to align the multiple data signals of the multiple data lines using the multiple latches.

10. The memory device of claim 9, wherein:
the logic circuitry includes a clock tree with multiple clock lines, the clock tree configured to delay at least one clock signal of multiple clock signals of the multiple clock lines using at least one line delay; and
the logic circuitry is configured to remove the one or more relative phase offsets to align the multiple data signals of the multiple data lines using the multiple clock signals.

11. The memory device of claim 10, wherein:
the logic circuitry includes multiple flip-flops, an output of each respective flip-flop of the multiple flip-flops coupled to a respective latch of the multiple latches; and
the logic circuitry is configured to remove the one or more relative phase offsets to align the multiple data signals of the multiple data lines using the multiple flip-flops.

12. The memory device of claim 11, wherein:
the logic circuitry includes at least one register corresponding to the command;
an input of each flip-flop of the multiple flip-flops is coupled to the multiple clock lines; and
the logic circuitry is configured to delay at least a portion of the multiple data signals of the multiple data lines using the multiple flip-flops and at least one value of the at least one register that corresponds to the command.

13. The memory device of claim 1, wherein the logic circuitry is configured to:
receive a second command to deactivate multiphase communication across two or more data lines of the multiple data lines.

14. The memory device of claim 13, wherein the logic circuitry is configured to:
receive a third command to activate multiphase communication across the two or more data lines of the multiple data lines.

15. A host device comprising:
an interface configured to be coupled to an interconnect including multiple data lines; and
a memory controller coupled to the interface and including control logic, the control logic configured to:
transmit data to a memory device according to different phase offsets across the multiple data lines, the different phase offsets based on a command indicative of a phase offset for a first data line of the multiple data lines relative to a second data line of the multiple data lines.

16. The host device of claim 15, wherein the control logic is configured to:
determine the different phase offsets across the multiple data lines; and
transmit to the memory device the command indicative of the phase offset for the first data line of the multiple data lines relative to the second data line of the multiple data lines.

17. The host device of claim 16, wherein the control logic is configured to:
write test data values to the memory device using the multiple data lines in accordance with various phase offsets;
read other data values from the memory device using the multiple data lines and based on the writing of the test data values;
compare the test data values to the other data values; and
determine the different phase offsets based on the comparing and the various phase offsets.

18. The host device of claim 15, wherein the control logic is configured to:
receive second data from the memory device according to second different phase offsets across the multiple data lines, the second different phase offsets based on a second command indicative of a second phase offset for the first data line of the multiple data lines relative to the second data line of the multiple data lines.

19. A method for a memory device, the method comprising:
- receiving a command;
- mapping the command to at least one entry of multiple entries, the at least one entry of the multiple entries configured to store respective phase offset indications for respective data lines of multiple data lines;
- receiving a memory request; and
- processing a memory operation with the respective phase offset indications responsive to the memory request and based on the command.

20. The method of claim 19, further comprising:
- receiving data over the multiple data lines in accordance with the respective phase offset indications and the memory request;
- receiving a second command;
- mapping the second command to at least one second entry of the multiple entries, the at least one second entry of the multiple entries configured to store second respective phase offset indications for respective data lines of the multiple data lines;
- receiving a second memory request; and
- transmitting second data over the multiple data lines in accordance with the second respective phase offset indications and the second memory request.

\* \* \* \* \*